United States Patent [19]

Bormann et al.

[11] 4,004,285
[45] Jan. 18, 1977

[54] READ-WRITE CIRCUITRY FOR ONE TRANSISTOR PER BIT RANDOM ACCESS MEMORY

[75] Inventors: Alan Richard Bormann, Tempe, Ariz.; Robert Tapei Yu, Sunnyvale, Calif.

[73] Assignee: Motorola, Inc., Chicago, Ill.

[22] Filed: June 30, 1975

[21] Appl. No.: 591,676

[52] U.S. Cl. ..................... 340/173 CA; 340/173 R
[51] Int. Cl.² ......................................... G11C 11/40
[58] Field of Search ... 340/173 CA, 173 R, 173 FF, 340/173 CC, 173 DR; 307/238

[56] References Cited

UNITED STATES PATENTS

| 3,838,295 | 9/1974 | Lindell | 340/173 CA |
| 3,936,810 | 2/1976 | Dunn | 340/173 R |

OTHER PUBLICATIONS

Stein et al., "Storage Array and Sense/Refresh Circuit for Single-Transistor Memory Cells," IEEE Journal of Solid-State Circuits, vol. SC-7, No. 5, Oct. 1972, pp. 336–340.

Primary Examiner—Thomas A. Robinson
Attorney, Agent, or Firm—Charles R. Hoffman

[57] ABSTRACT

A random access memory includes a plurality of one-transistor storage cells. A plurality of sense-write conductors are included, each connected to a plurality of storage cells in a row of storage cells. A plurality of regenerative sense amplifiers are each coupled to two sense-write conductors. A one-transistor dummy storage cell is connected to each sense-write conductor. Read-write circuitry is coupled between a data conductor of the memory chip and a storage node of one of the dummy storage cells of each row of storage cells. The dummy storage cell is selected whenever a storage cell on the opposite side of the regenerative sense amplifier is selected. Charge initially stored in the selected storage cell is redistributed on the opposite sense-write conductor and is subsequently amplified by the sense amplifier, and produced in inverted amplified form at the storage node of the dummy storage cell. Capacitive loading on all of the sense-write conductors of the memory chip during redistribution of charge in the selected storage cell is thereby reduced, thereby increasing the magnitude of the sense-write conductor voltage transitions when a storage cell is selected.

12 Claims, 1 Drawing Figure

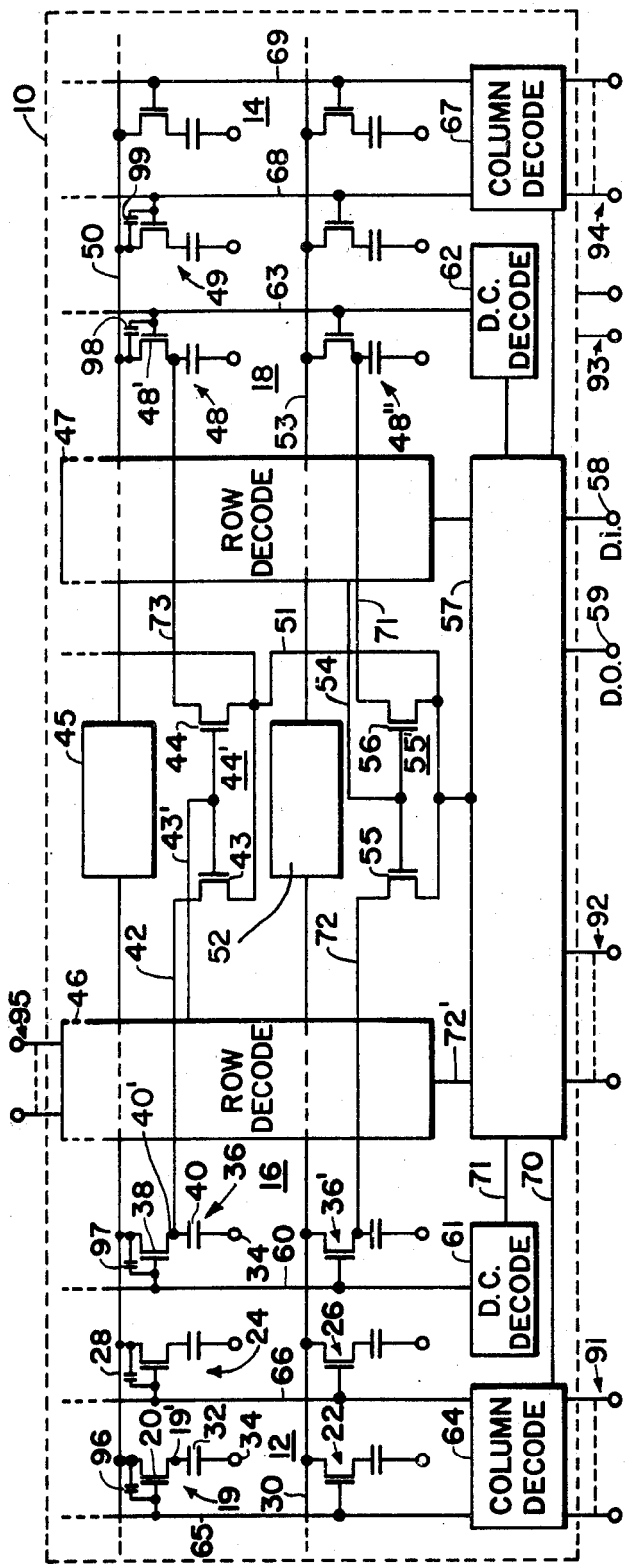

READ-WRITE CIRCUITRY FOR ONE TRANSISTOR PER BIT RANDOM ACCESS MEMORY

BACKGROUND OF THE INVENTION

1. Field of the Invention

This invention relates to read-write circuitry for semiconductor memories.

2. Description of the Prior Art

Single transistor storage cells have been utilized to implement random access memories. The single transistor storage cells usually include a MOSFET having its gate connected to a selection conductor, its drain connected to a sense-write conductor and its source connected to a storage node. The storage cell also includes a storage capacitor connected between the storage node and a common voltage conductor. In order to achieve a large number of storage cells in a small amount of semiconductor chip area it is desirable that the storage capacitor be very small. A plurality of such storage cells are connected to a single sense-write conductor and thereby comprise one row of many rows forming a rectangular array of storage cells. Consequently, the capacitance associated with the sense-write conductor is very large compared to that of the storage capacitor of each storage cell. Sensing is accomplished by selection of the storage cell by turning on the MOSFET, and causing the charge stored on the storage capacitor of the selected storage cell to be redistributed to the capacitance of the sense-write conductor, resulting in a relatively small voltage transition of the sense-write conductor. Consequently, sensitive sense amplifiers have been developed capable of sensing and amplifying such small voltage transitions. Read-write circuitry is normally coupled directly to the sense-write conductors. However, such read-write circuitry increases the capacitance of the sense-write conductor even more, and reduces the size of the voltage transition achieved by selecting a storage cell. Heretofore, the solution has been to increase the size of the storage capacitor of each storage cell, thereby increasing the size and cost of the semiconductor memory or by increasing the sensitivity of the sense amplifier, which normally involves more complex, more area consuming, and consequently, more expensive sense amplifiers, which in turn increases the cost of the memory product.

SUMMARY OF THE INVENTION

It is an object of this invention to provide a semiconductor memory system wherein read-write circuitry is coupled to a sense-write conductor by means of a selection MOSFET of a dummy storage cell.

Briefly described, the invention is a semiconductor memory having a plurality of storage cells and a sense-write conductor coupled to a plurality of the storage cells. A sense amplifier circuit is coupled to the sense-write conductor. A dummy storage cell having a storage node is also coupled to the sense-write conductor. An input/output circuit is coupled between the storage node of the dummy storage cell and a data terminal of the semiconductor memory for selectively transferring data between the data terminal and the sense-write conductor during a read operation or a write operation and isolating the data terminal from the sense-write conductor at times other than during a read operation or write operation.

BRIEF DESCRIPTION OF THE DRAWING

The sole FIGURE is a partial schematic diagram of a semiconductor memory chip in accordance with the invention.

DESCRIPTION OF THE INVENTION

Referring to the FIGURE, it is seen that semiconductor memory chip 10 includes a left hand array 12 of one transistor memory storage cells including storage cells 19 and 24 connected to sense-write conductor 28 and storage cells 22 and 26 coupled to sense-write conductor 30. The dotted lines indicate expansion of the number of rows and columns of identical storage cells. Memory chip 10 also includes a right hand array 14 including a plurality of identical storage cells such as 49 connected to sense-write conductor 50 and a plurality of one transistor storage cells connected to sense-write conductor 53.

Again, the dotted lines indicate expansion of rows and columns of storage cells. The construction of the one transistor memory cell is described with reference to memory cell 19, which includes MOSFET (MOS field effect transistor) 20 and storage capacitor 32. MOSFET 20 has its drain connected to sense-write conductor 28 and its source connected to a storage node 19' and its gate connected to column selection conductor 65. Storage capacitor 32 has one electrode connected to the source of MOSFET 20 and its other electrode connected to common voltage conductor 34.

It is seen that all of the storage cells in arrays 12 and 14 are arranged in rows and columns, and that in each array all of the storage cells in a given row have the drain of their respective MOSFETs connected to the same sense-write conductor. It is also seen that the gate of each MOSFET in a given column is connected to the same column selection conductor, such as column selection conductors 65, 66, 68 or 69.

Semiconductor memory chip 10 also includes two columns of dummy storage cells. Column 16 includes dummy storage cells 36 and 36', while column 18 includes dummy storage cells 48'' and 48'. Actually, as the dotted line indicates there is one dummy storage cell for each row of storage cells in each of arrays 12 and 14.

Each of the dummy storage cells, including dummy storage cell 36, is schematically the same as the storage cells in arrays 12 and 14. For example, dummy storage cell 36 includes MOSFET 38 having its drain connected to sense-write conductor 28, its gate connected to dummy storage cell selection conductor 60, and its source connected to storage node 40' and to one electrode of storage capacitor 40, the other electrode of which is connected to common voltage conductor 34. The dummy storage cell in each row of each array is connected to the sense-write conductor, such as 28, 30, 50 or 53 of that particular row of the respective array.

Each of the column selection conductors such as 65 and 66 in array 12 is driven by column decode circuitry 64. The structure of the circuitry included in column decode circuitry 64 is readily implementable using techniques known to those skilled in the art, and typically includes decode gates and address inverters. See U.S. Pat. No. 3,760,380 assigned to the present assignee, by Hoffman et al.

The inputs to the address inverters are the address inputs 91, 94, 95 to MOS memory chip 10. Similarly, the column selection conductor such as 68 and 69 and right hand array 14 are connected to column decode circuitry 67, which is similar to the circuitry of column decode circuitry 64, except that different address inputs are connected thereto.

A sense amplifier, such as 45, is connected between the sense-write conductors of each array for each row in the memory. For example, sense-amplifier 45 is connected between sense-write conductor 28 and sense-write conductor 50. Similarly, sense amplifier 52 is connected between sense-write conductors 30 and 53. Incidentally, the dotted extension of the sense-write conductors and the column selection conductors in FIG. 1 indicate that the memory array and the decode are section expandable in both the horizontal and vertical directions.

Associated with each row of storage cells and the respective sense amplifier, is an input-output control circuit such as 44', or 55'. Input-output control circuit 44' includes MOSFET 44, which has its gate electrode connected to conductor 43' and its drain connected to conductor 73, which is connected to the storage node of dummy cell storage 48. MOSFET 44 has its source connected to data conductor 51. Input-output control circuit 44' also includes MOSFET 43 having its gate connected to conductor 43', its drain connected to conductor 42, which in turn is connected to the storage node of dummy storage cell 36, its source connected to data conductor 51. The other input-output control circuits, one associated with each row of the memory storage cells, are constructed entirely similarly. The source electrodes of all of the MOSFETs, such as 43, 44, 55, 56 are connected to the common data conductor 51. The gate electrodes of such MOSFETs are respectively coupled to row decode means 46, 47, which in a practical implementation is split so that half of the row decode circuitry is situated to the right side of sense amplifiers 45 and the other half is located to the left thereof.

The circuitry in row decode circuits 46 and 47 is also readily implementable by those skilled in the art and may be quite similar in structure to that in column decode circuitry 64 and 67. Control circuitry 57 is coupled to row decode circuitry 46 and 47, dummy storage cell decode circuitry 61 and 62, and column decode circuitry 64 and 67. Data input terminal 58 and data output terminal 59 are also connected to control circuitry 57, as is data conductor 51. Control circuitry 57 is intended to represent generalized timing, clocking, and input-output circuitry readily implementable by those skilled in the art of semiconductor memory design. See the above mentioned patent by Hoffman et al.

Column address inputs 91 are coupled to column decode circuit 64 and column address inputs 94 coupled to column decode 67. There are M column address inputs where $2^M$ is the number of columns in memory chip 10. Row address inputs 95 are coupled to row decode circuitry 46, and are understood to be coupled to row decode circuitry 47. There are N row address inputs where there are $2^N$ rows in memory chip 10.

It should be pointed out that the structure and operation of MOSFETs is well known to those skilled in the semiconductor arts. However, for a more detailed description of MOSFETs the reader may refer to Physics and Technology of Semiconductor Devices by A. S. Grove, John Wiley and Sons, Inc., 1967. It should be noted, as used herein, the terms "source" and "drain" used with reference to the connections of MOSFETS, are interchangeable, since these electrodes of a MOSFET function as either sources or drains, depending upon bias conditions, since a MOSFET is a bilateral device as far as switching applications are concerned.

The operation of memory chip 10, as it relates to the inventive concept herein, is described with reference to the FIGURE.

Any particular combination of the row selection and column selection address inputs results in the selection of one and only one storage cell, which may be in either array 12 or array 14. In other words, one column is selected and one row is selected; this results in selection of the storage cell at the intersection thereof.

Assume for purposes of discussion, that a logical "1" is stored at storage node 19' of storage cell 19. Storage cell 19 is selected by applying a logical "1" to column selection conductor 65 by means of column decode circuit 64. This accomplishes selection of the desired column. Prior to column selection, however, sense-write conductors 28 and 50 have been equalized in potential. This is accomplished by means of precharge circuitry, which may be associated with sense amplifier 45 or separate therefrom. Such precharge circuitry is well known to those skilled in the art and need not be detailed herein. When MOSFET 20 of storage cell 19 is turned on, the charge stored on storage capacitor 32 will be redistributed with the capacitance of sense-write conductor 28. Also, some charge will be coupled between column selection conductors 65 and sense-write conductor 28 by parasitic capacitor 96, which is shown between the gate and drain of MOSFET 20.

The operation of the memory circuit is such that whenever any column in array 12 is selected, dummy storage cell decode circuit 62 causes dummy storage cell selection conductor 63 to turn on all of the dummy storage cells connected thereto, so that parasitic capacitor 98 associated with dummy storage cell 48 couples a like amount of charge (on parasitic capacitor 96) onto sense-write conductor 50. Therefore, after all of the charge initially stored on storage capacitor 32 and the parasitic capacitance of sense-write conductor 28, is redistributed on storage capacitor 32, the voltage difference, (or lack of a voltage difference) between sense-write conductors 28 and 50 is due solely to the amount of charge representative of the stored logic state, initially stored on storage capacitor 32 of the selected storage cell 19.

Sense amplifier 45 is designed to be sensitive enough to detect this voltage difference as being indicative of an initially stored logical 1 or logical 0 in storage cell 19. Typically, the voltage difference for a stored logical 1 may be about 200 millivolts for the present state of the art, even though initially a voltage of the order of 15 or more volts different from the equalization voltage of the sense-write conductors was initially stored on the storage capacitance. This is because the capacitance of the storage capacitor, such as capacitor 32, is far smaller than the parasitic capacitance associated with the sense-write conductors.

In order to increase the size of the voltage transition of a sense-write conductor corresponding to a stored logical state of the selected storage cell, it is very desirable that the circuitry coupled to the sense-write conductors to accomplish read and write operations add as little capacitance as possible. In accordance with the present invention, the column selection and input-output circuitry, such as 44', is not connected directly to any of the sense-write conductors, but is instead coupled to the storage nodes of the various dummy storage cells, as described hereinabove. Thus, the parasitic capacitance associated with all of the input-output circuitry which would otherwise add to the parasitic capacitance of the sense-write conductors is eliminated. Instead, according to the present invention, the selection MOSFET of each of the dummy storage cells is turned off during the above-described stored charge redistribution and during sensing and amplification of the resulting voltage transition of the associated sense-write conductor by sense-amplifier 45. Sense amplifier 45 acts to sense the small voltage transition and may regeneratively amplify it so that a large logical 1 or logical 0 voltage appears on sense-write conductor 50. Then, during the following portion of a read operation, MOSFET 48' of dummy storage cell 48 is turned on and the amplified voltage on sense-write conductor 50 is transferred or coupled by means of MOSFET 44 to data conductor 51, which is then amplified and gated, by input or output circuitry associated with control circuitry 57, to data output terminal 59.

Column selection, as mentioned above is accomplished by means of a voltage applied to conductor 43' by row decode circuitry 46, thereby turning on MOSFET 44. During a writing operation, input data applied to data input terminal 58 is gated by circuitry in section 57 to data conductor 51 and is then coupled to the storage node of the dummy storage cell of the selected row and from there is coupled by means of a dummy storage cell MOSFET to the sense-write conductor 50 and is coupled to sense amplifier 45, overriding whatever state is stored therein, and from there is coupled to the opposite sense-write conductor and through MOSFET 20 to storage node 32 of selected storage cell 19.

What is claimed is:

1. A semiconductor memory having a plurality of storage cells, first and second sense-write conductors coupled, respectively, to first and second groups of said storage cells, a sense amplifier circuit coupled between said first and second sense-write conductors, first and second dummy storage cells coupled, respectively, to said first and second sense-write conductors, said first and second dummy storage cells having first and second storage nodes, respectively, said semiconductor memory comprising input-output circuit means coupled to said first and second storage nodes for selectively coupling said input-output circuit means to said first and second storage nodes during a portion of a read operation or a write operation.

2. The semiconductor memory as recited in claim 1 wherein each of said plurality of storage cells includes a storage node, a first MOSFET having a drain electrode coupled, respectively, to a one of said sense-write conductors and a source electrode coupled to its storage node and a storage capacitor coupled between said storage node and a common voltage conductor.

3. The semiconductor memory as recited in claim 2 wherein each of said dummy storage cells includes a MOSFET having its drain coupled to a sense-write conductor, a source electrode coupled to a storage node and a gate electrode coupled to a dummy storage cell selection conductor and a storage capacitor connected between said storage node and said common voltage conductor.

4. The semiconductor memory as recited in claim 3 wherein said input-output circuit means includes a first MOSFET having its drain connected to said first storage node and its source connected to an input-output conductor and a second MOSFET having its drain connected to said second storage node and its source connected to said data input-output conductor and its gate connected to the gate of said first MOSFET.

5. The MOS semiconductor random access memory as recited in claim 4 wherein said gates of said first and second MOSFETs are coupled to a row decode circuit.

6. A semiconductor memory having a plurality of storage cells and a sense-write conductor coupled to a plurality of said storage cells, and a sense amplifier circuit coupled to said sense-write conductor, and a dummy storage cell having a storage node coupled to said sense-write conductor comprising input-output circuit means coupled between said storage node and a data terminal of said semiconductor memory for selectively transferring data between said data terminal and said sense-write conductor during a read operation or a write operation without loading said sense-write conductor at times other than during a read operation or a write operation.

7. A MOS semiconductor random access memory including first and second arrays of one-transistor storage cells arranged in rows and columns, each row of said one-transistor storage cells being coupled, respectively, to a common sense-write conductor each column of said one-transistor storage cells being coupled to a column selection conductor, a plurality of sense amplifiers, one for each row, each coupled, respectively, between said sense-write conductor of said row of said first array and a corresponding sense-write conductor of said row of said second array, a dummy storage cell connected, respectively, to each of said sense-write conductors, said MOS semiconductor random access memory comprising input-output circuit means coupled between a storage node of said dummy storage cell connected to said sense-write conductor of said row of said first array and a storage node of said dummy storage cell connected to said corresponding sense-write conductor of said row of said second storage array.

8. The MOS semiconductor random access memory as recited in claim 7 further including dummy storage cell decode circuit means coupled to a gate electrode of a plurality of said dummy storage cells coupled to sense-write conductors of said first array and also coupled to column decode means for selecting said plurality of dummy storage cells whenever a column of storage cells in said second array is selected by said column decode means.

9. A method of operating a semiconductor memory including a plurality of storage cells coupled to a sense-write conductor coupled to a sense amplifier comprising selectively coupling data between said sense-write conductor and a data terminal of said semiconductor memory through a selection transistor of a dummy storage cell connected to said sense-write conductor during a read or write operation and isolating said data terminal from said sense-write conductor at times other than during a read or write operation.

10. A semiconductor memory having a plurality of storage cells, first and second sense-write conductors coupled, respectively, to a plurality of said storage cells, a sense amplifier circuit coupled between said first and second sense-write conductors, first and second dummy storage cells coupled, respectively, to said first and second sense-write conductors, said first and second dummy storage cells having first and second storage nodes, respectively, said semiconductor memory comprising input-output circuit means coupled to said first storage node for selectively coupling said input-output circuit means to said first storage node during a portion of a read operation or a write operation and for isolating said input-output circuit means from said first storage node at times other than during said portions of a read operation or a write operation.

11. A semiconductor memory having a plurality of storage cells, first and second sense-write conductors coupled, respectively, to a plurality of said storage cells, a sense amplifier circuit coupled between said first and second sense-write conductors, first and second dummy storage cells coupled, respectively, to said first and second sense-write conductors, said first and second dummy storage cells having first and second storage nodes, respectively, said semiconductor memory comprising input-output circuit means coupled between first storage node and a data terminal of said semiconductor memory for selectively transferring data between said data terminal and said first sense-write conductor during a portion of a read operation or a write operation and isolating said data terminal from said first sense-write conductor during other portions of said read operation or said write operation.

12. The MOS semiconductor random access memory as recited in claim 11 wherein said column decode means includes a first column decoder circuit coupled to all of said column selection conductors of said first array and a second column decode circuit coupled to all of said column selection conductors of said second array.

* * * * *